United States Patent
Hof et al.

(10) Patent No.: US 9,621,188 B2
(45) Date of Patent: Apr. 11, 2017

(54) SOFT AND HARD DECISION MESSAGE-PASSING DECODING

(71) Applicant: SAMSUNG ELECTRONICS CO., LTD., Suwon-si, Gyeonggi-Do (KR)

(72) Inventors: Eran Hof, Haifa (IL); Jun Jin Kong, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 314 days.

(21) Appl. No.: 14/215,659

(22) Filed: Mar. 17, 2014

(65) Prior Publication Data

US 2015/0263760 A1    Sep. 17, 2015

(51) Int. Cl.
| | |
|---|---|
| *H03M 13/11* | (2006.01) |
| *H03M 13/00* | (2006.01) |
| *H03M 13/37* | (2006.01) |
| *H03M 13/15* | (2006.01) |
| *H03M 13/19* | (2006.01) |
| *H03M 13/29* | (2006.01) |

(52) U.S. Cl.
CPC ... *H03M 13/1108* (2013.01); *H03M 13/3707* (2013.01); *H03M 13/1111* (2013.01); *H03M 13/152* (2013.01); *H03M 13/1515* (2013.01); *H03M 13/19* (2013.01); *H03M 13/2957* (2013.01)

(58) Field of Classification Search
None
See application file for complete search history.

(56) References Cited

U.S. PATENT DOCUMENTS

| | | | |
|---|---|---|---|
| 8,429,498 B1 * | 4/2013 | Anholt | G06F 11/1048 365/227 |
| 8,473,826 B1 * | 6/2013 | Caldwell | H03M 13/1515 714/784 |
| 2009/0158127 A1 | 6/2009 | Miyauchi et al. | |
| 2009/0177931 A1 | 7/2009 | Song et al. | |
| 2010/0275096 A1 | 10/2010 | Zhong et al. | |
| 2011/0010600 A1 | 1/2011 | Gong et al. | |
| 2011/0072331 A1 | 3/2011 | Sakaue et al. | |
| 2011/0113294 A1 | 5/2011 | Chugg et al. | |
| 2011/0231738 A1 | 9/2011 | Horisaki | |
| 2012/0221775 A1 | 8/2012 | Kim et al. | |
| 2012/0240007 A1 | 9/2012 | Barndt et al. | |
| 2015/0220389 A1 * | 8/2015 | Kim | G06F 11/1048 714/764 |

\* cited by examiner

*Primary Examiner* — Justin R Knapp
(74) *Attorney, Agent, or Firm* — F. Chau & Associates, LLC

(57) ABSTRACT

A decoder unit is configured to perform a decoding on encoded data. The decoder unit includes a data bus comprising a number N of data lines, a local memory configured to store messages for a message-passing decoding and communicate the messages across the data bus, a plurality of first decoder processing units, wherein each first decoder processing unit is configured to perform the message-passing decoding by communicating with the local memory using a number A of the data channels, and a plurality of second decoder processing units, where each second decoder processing unit is configured to perform the message-passing decoding by communicating with the local memory using a number B of the data lines. N is at least two, A and B are less than or equal to N, and A is different from B.

9 Claims, 10 Drawing Sheets

SOFT AND HARD DECISION MESSAGE-PASSING DECODING

BACKGROUND

1. Technical Field

The present inventive concept relates generally to a message-passing decoding, and more particularly to utilization of memory in soft and hard decision decoders.

2. Discussion of Related Art

Forward error correction (FEC) is a technique for controlling errors in the received messages over unreliable or noisy communication channels and storage devices. Source information is encoded in a redundant way using an error-correcting code (ECC). The redundancy allows the decoder to detect a limited number of errors that may occur anywhere in the message, and often to correct these errors without retransmission.

The two main categories of FEC codes are block codes and convolutional codes. Block codes work on fixed-size blocks (packets) of bits or symbols of predetermine size. Convolutional codes work on bit or symbol streams of arbitrary length. Classical FEC schemes are usually implemented using hard-decision decoding techniques, where a hard decision is made before the decoder operates and not afterwards. That is, first a decision is made for each individual bit and then the decoder operates on that stream of bits (which may include erroneous bits to be corrected). Soft-decision decoding on the other hand operates on richer observations. For example, in communication systems, it is usually discretized analog signals. Soft decision decoding techniques allow for more improved error performance than hard decision decoding techniques. However, soft decision decoding techniques are costly in terms of implementation and additional performance measures.

Modern decoding schemes are based on message-passing techniques. During a decoding process that uses a message-passing technique, which is usually an iterative process, intermediate messages are made by the decoding process. These messages are stored in a dedicated memory, and these messages are frequently updated and utilized by a processing device in charge of the decoding. The cardinality of the set of possible decoder messages has a substantial effect on the performance of message-passing decoding techniques. Usually hard decision decoding techniques require messages with lower alphabet cardinality than soft decision decoding techniques. The cardinality of the message alphabet contribute to the size of the dedicated memory for the tentative storage of the decoder messages. Consequently, hard decision decoding generally uses less memory than soft decision decoding. It is common to implement a decoding device such that the inner memory used for messages in a message-passing decoding technique will support both hard and soft decision decoding techniques. Thus, a large part of the memory of a decoder that performs both hard and soft decision is idle when hard decision decoding is performed.

Accordingly, there is a need for a more efficient utilization of memory in implementing soft and hard decision decoders. This need is further stressed where several parallel decoding units are operating in parallel within a single device.

SUMMARY

According to an exemplary embodiment of the inventive concept, a decoder unit is configured to perform a decoding on encoded data. The decoder unit includes a data bus having a number N of data channels, a local memory configured to store messages for a message-passing decoding and communicate the messages across the data bus, a plurality of first decoder processing units, where each first decoder processing unit is configured to perform the message-passing decoding on the encoded data by communicating with the local memory using a number A of the data bus lines, and a plurality of second decoder processing units, where each second decoder processing unit is configured to perform the message-passing decoding on the encoded data by communicating with the local memory using a number B of the data bus lines. N is at least two, A and B are less than or equal to N, and A is different from B.

According to an exemplary embodiment of the inventive concept, a decoder unit is configured to perform a decoding on encoded data. The decoder unit includes data bus with a plurality of data lines, a local memory, and first, second, and third decoder processing units. The local memory is configured to store messages for a message-passing decoding and communicate the messages across the data bus. The first decoder processing unit is configured to perform a hard decision decoding on the encoded data by communicating with the local memory using a first part of the data lines. The second decoder processing unit is configured to perform a hard decision decoding on the encoded data by communicating with the local memory using a second part of the data lines. The third decoder processing unit is configured to perform a soft decision decoding on the encoded data by communicating with the local memory using all of the data lines.

According to an exemplary embodiment of the inventive concept, a solid state storage device includes a data bus with a plurality of data lines, a first memory configured to store encoded data, a decoder unit, and a controller. The decoder unit is configured to perform a message-passing decoding on the encoded data. The decoder unit includes a second memory configured to store messages for the message-passing decoding and communicate the messages across the data bus. The decoder unit includes first, second, and third decoder processing units. The first decoder processing unit is connected to a first part of the data lines. The second decoder processing unit is connected to a second part of the data lines. The third decoder processing unit is connected to all of the data lines.

According to an exemplary embodiment of the inventive concept, a decoder unit is configured to perform a decoding on encoded data. The decoder unit includes a data bus with a plurality of data lines, a local memory configured to store messages for a message-passing decoding and communicate the messages across the data bus, a first decoder processing unit configured to perform a hard decision decoding on the encoded data by communicating with the local memory using a first part of the data lines, a second decoder processing unit configured to perform a hard decision decoding on the encoded data by communicating with the local memory using a second part of the data lines, and a third decoder processing unit configured to perform a hard decision decoding on the encoded data by communicating with the local memory using all of the data lines.

BRIEF DESCRIPTION OF THE DRAWINGS

The present inventive concept will become more apparent by describing in detail exemplary embodiments thereof with reference to the attached drawings, in which.

DETAILED DESCRIPTION

The present inventive concept and methods of accomplishing the same may be understood more readily by reference to the following detailed description of exemplary embodiments thereof and the accompanying drawings. The present inventive concept may, however, be embodied in many different forms and should not be construed as being limited to the exemplary embodiments set forth herein. Like numbers refer to like elements throughout.

The use of the terms "a" and "an" and "the" and similar references in the context of describing the invention are to be construed to cover both the singular and the plural, unless otherwise indicated herein or clearly contradicted by context.

The term "unit", as used herein, means, but is not limited to, a software or hardware component, such as a field programmable gate array (FPGA) or an application specific integrated circuit (ASIC), which performs certain tasks. A unit or module may be configured to reside in an addressable storage medium and configured to execute on one or more processors.

Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units or modules may be combined into fewer components and units or modules or further separated into additional components and units or modules.

Figure 1:
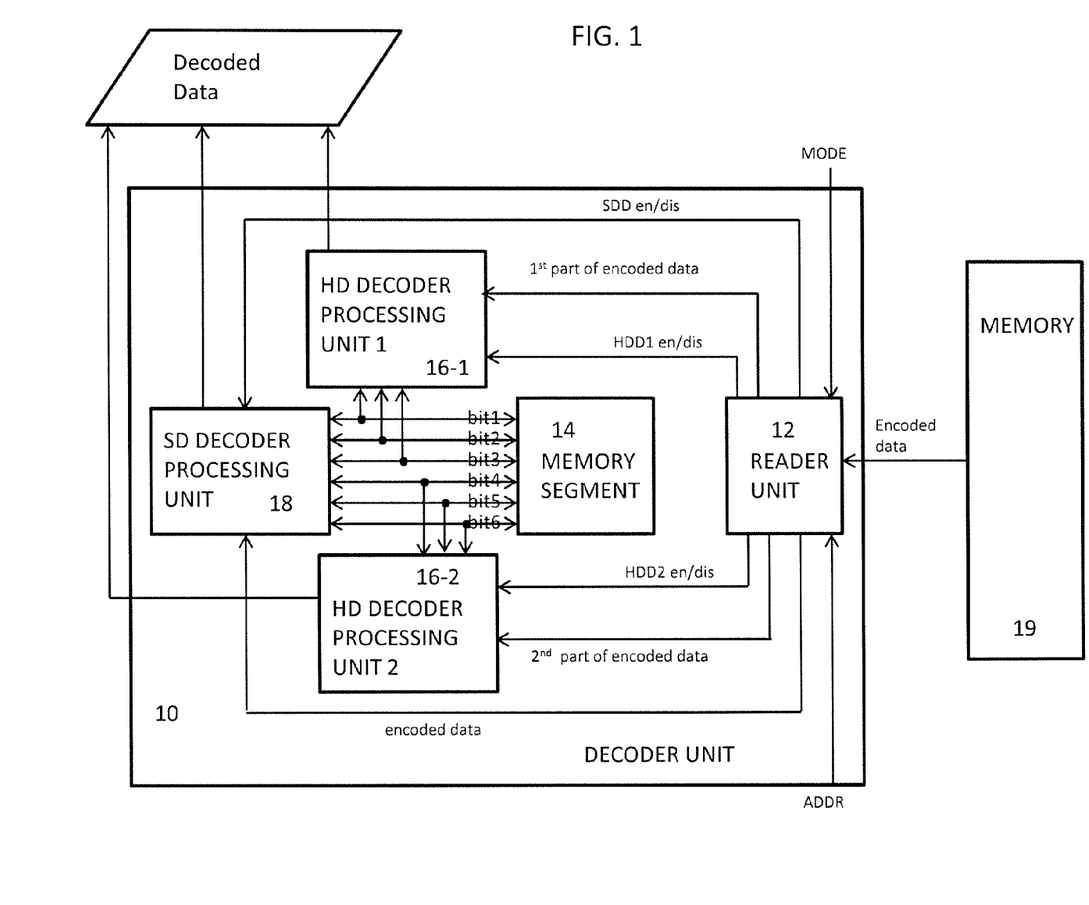
FIG. 1 is a block diagram showing a decoder unit according to an exemplary embodiment of the present inventive concept.

FIG. 1 is a block diagram showing a decoder unit according to an exemplary embodiment of the present inventive concept. Referring to FIG. 1, a decoder unit 10 includes a reader unit 12, a memory segment 14, a first hard decision decoder processing unit 16-1, a second hard decision decoder processing unit 16-2, and a first soft decision decoder processing unit 18. The decoding unit 10 may include additional hard or soft decision decoder processing units. The memory segment 14 may be a volatile memory or a non-volatile memory. Each processing unit (e.g., 16-1, 16-2, and 18) may include its own internal memory and a processor.

In an exemplary embodiment of the inventive concept, each of the decoder processing units is a message-passing decoder. For example, a decoding process performed by a message-passing decoder may be an iterative process, where intermediate messages are generated for storage/update in memory segment 14.

Figure 2:
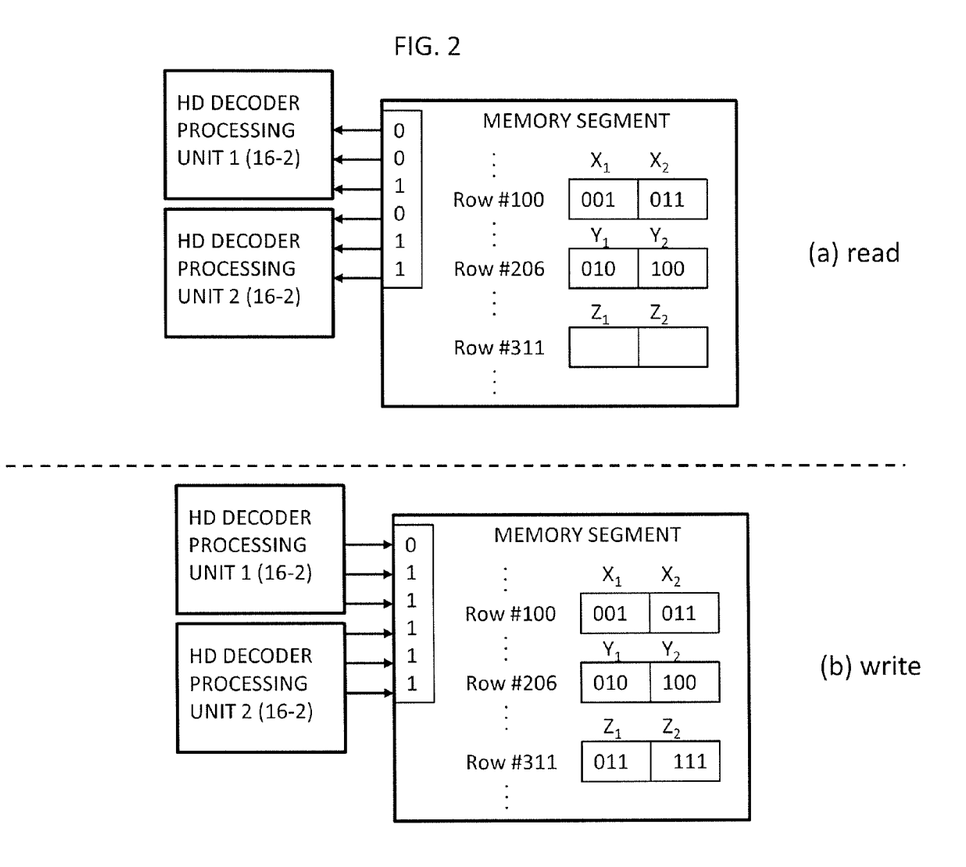
FIG. 2 is an example of the decoder unit of FIG. 1 performing an operation during a decoding.

FIG. 2 illustrates an example of the hard decision decoder processing units 16-1 and 16-2 interfacing with the memory segment 14 when performing respective decoding processes on encoded data. In this example, the decoder processing units 16-1 and 16-2 are each performing a same calculation, namely summing data variables X and Y to yield Z, and these variables are needed to decode encoded data received from reader unit 12. The first decoder processing unit 16-1 stores its versions of these variables (e.g., $X_1$, $Y_1$, $Z_1$) in one part of the memory segment 14 (e.g., column 1) and the second decoder processing unit 16-2 stores its versions of these variables (e.g., $X_2$, $Y_2$, $Z_2$) in another part of the memory segment 14 (e.g., column 2). In this example, the data bus between the decoder processing units 16-1 and 16-2 is a 6-bit data bus, where during a given read/write command cycle, each decoder is capable of either reading or writing 3 bits of data.

Part (a) of FIG. 2 shows an example of a read of variable X being performed by each of the decoder processing units. For example, the first decoder processing unit 16-1 reads a 3 bit variable $X_1$ of "001" from memory segment 14 through the first 3 bits of the data bus while the second decoder processing unit 16-2 reads a 3 bit variable $X_2$ of "011" from the memory segment 14 through the second three bits of the data bus. Each read set of 3-bits may be referred to as a passed message, hence message-pass decoding.

Part (b) of FIG. 2 shows an example of a write of variable Z being performed by each of the decoder processing units. For example, the first decoder processing unit 16-1 writes a 3 bit variable $Z_1$ of "011" to memory segment 14 through the first 3 bits of the data bus, while the second decoder processing unit 16-2 writes a 3 bit variable $Z_2$ of "111" to the memory segment 14 through the second three bits of the data bus. Each written set of 3-bits may be referred to as a passed message. The soft decision decoder processing unit 18 interfaces with the memory segment 14 in a similar manner, except it uses the entire data bus.

The hard decision decoder processing units 16-1 and 16-2 perform hard decision decoding on input encoded data (e.g., message-pass decoding), and the soft decision decoder processing unit 18 performs soft decision decoding on input encoded data (e.g., message-pass decoding). In an exemplary embodiment of the inventive concept, at least one of the hard decision decoder processing units 16-1 and 16-2 is also configured to perform soft decision decoding, but only if it is provided with additional bits per tentative message. For example, if the first decoder processing unit 16-1 were modified to additionally perform soft decision decoding, the additional data lines (e.g., bits 4-6) shown as connected to the soft decision decoder processing unit 18 would be connected to unit 16-1. In this embodiment, unit 18 can be omitted, and unit 16-1 can be configured to either perform hard decision decoding with respect to part of the data lines or soft decision decoding with respect to all the data lines.

The soft decision decoder processing unit 18 is used to decode data that has been encoded with an ECC. The inputs to the soft decision decoder processing unit 18 may take a range of values (e.g. probability real values between 0 and 1, integral values between a given positive and negative constrains etc.). This extra information usually indicates the reliability of each input data point, and is used to form better estimates of the original data. In an exemplary embodiment, the soft decision decoder 18 employs message passing (e.g., belief-propagation) decoding algorithms for Low-density parity-check (LDPC) codes such as min-sum decoding, sum-product decoding, or for additional Turbo and Turbo-like codes, etc.

In an exemplary embodiment the hard decision decoding employs either message-passing decoding for LDPC codes such as min-sum decoding, sum-produced decoding, Gallager A and B algorithms, decoding with erasures at the decoder or other iterative techniques such as bit-flipping decoding, or back-substitution techniques.

Turbo codes and LDPC codes are a class of high-performance FEC codes, which closely approach the maximum capacity of the data bus. Turbo codes and LDPC codes may be used in 3G mobile communications and satellite communications as well as other applications where designers seek to achieve reliable information transfer over bandwidth or latency constrained communication links in the presence of data corrupting noise. Accordingly, in an exemplary embodiment of the inventive concept, the soft decision processing 18 and hard decoder processing units 16 functions as message-passing decoders for LPDC codes or other turbo and turbo like codes.

In an exemplary embodiment of the inventive concept, the soft decision decoder 18 is a Viterbi decoder that receives a bitstream containing information about the reliability of each received symbol. For instance, in a 3-bit decoding, this reliability information is encoded "000" for strongest 0, "001" for relatively strong 0, "010" for relatively weak 0, "100" for weakest 1, "110" for relatively strong 1, etc. The hard decision decoding may be a Viterbi decoder that operates on hard decision readings (e.g. based on Hamming distance metric).

Referring back to FIG. 1, the decoder unit 10 is configured to operate in at least two different modes, namely a soft decision decoding mode and a hard decision decoding mode. In the soft decision decoding mode, the soft decision decoder processing unit 18 performs a decoding by exchanging 6-bit data with memory segment 14, and in the hard decision decoding mode, the two hard decision decoder processing units 16-1 and 16-2 simultaneously (in parallel) perform respective decoding operations by exchanging 3-bit data with the memory segment (by each one of the processing units). For example, as shown in FIG. 1, each of the six data lines between the memory segment 14 and the soft decision decoder 18 corresponds to one of the 6-bits, where a first 3 of the 6 data lines are connected to the first hard-decision decoder 16-1, and the last 3 of the 6 data lines are connected to the second hard-decision decoder 16-2.

The reader unit 12 reads encoded data (e.g., 128 KB, 256 KB, 1 Mb, etc.) from the memory 19. As an example, data may have been previously encoded using LDPC codes stored in memory 19. The reader unit 12 may receive an address signal ADDR indicating the location of the encoded data from an external source, such as a controller.

The reader unit 12 may be instructed by a controller (e.g., see 31 of FIG. 3) as to the current mode of operation (e.g., soft decision decoding mode or hard decision decoding mode), the location of the encoded data in memory 19 to read from, the amount of data to read, etc. For example, the controller 31 may place the decoder unit 10 into one of the soft and hard decision decoding modes by sending a mode signal MODE, and sending an address signal ADDR to the decoder unit 10 indicating the location of the encoded data within the memory 19. If the current mode of operation is the soft decision decoding mode, the reader unit 12 outputs the read encoded data to the soft decision decoder processing unit 18. If the current mode of operation is the hard decision decoding mode, the reader unit 12 provides twice the hard decision readings in order to enable the decoding of two codewords, one by processing unit 16-1 and the other by processing unit 16-2. In an exemplary embodiment, each of the processing units is operating on a different codeword of an LDPC, turbo or turbo-like codes.

If the decoder unit 10 is in the hard decision decoding mode, the reader unit 12 sends out a first hard decision enable signal (HDD1 en) to the first hard decision decoder processing unit 16-1, a second hard decision enable signal (HDD2 en) to the second hard decision decoder processing unit 16-2, and a soft decision disable signal (SDD dis) to the soft decision decoder processing unit 18. When the hard decision decoder processor units 16-1 and 16-2 are enabled, they perform a hard decision decoding on their respective inputs (e.g., encoded data input from reader unit 12), while making use of the memory segment 14 to store variables used in the decoding. For example, the enabled first hard decision decoder processing unit 16-1 could perform a hard decision decoding on a required amount (e.g. 1 KB) of data output from the reader unit 12, that requires it to write and read a multitude of messages to and from memory segment 14 using the first 3 bits of the data bus while the second hard decision decoder processing unit 16-2 performs a hard decision decoding on the same amount or a different amount of data output from the reader unit 12, that requires it to write and read a multitude of messages to and from the memory segment 14 using the second 3 bits of the data bus. The hard decision decoding by the 2 hard decision decoder processing units 16-1 and 16-2 may be performed simultaneously (parallel) or at substantially the same time. Since the soft decision decoder processing unit 18 is disabled, it does not perform a decoding while the hard decision decoding processing units 16-1 and 16-2 perform their respective decoding tasks. When the hard decision decoder processing units 16-1 and 16-2 have completed their decoding, they may output decoded data to controller 31. For example, the hard decision decoder processor units 16-1 and 16-2 may each output decoded data simultaneously to the controller 31.

If the decoder unit 10 is in the soft decision decoding mode, the reader unit 12 sends out a soft decision enable signal (SDD en) to the soft decision decoder processing unit 18, sends out a first hard decision disable signal (HDD1 dis) to the first hard decision decoder processing unit 16-1, and a second hard decision disable signal (HDD2 dis) to the second hard decision decoder processing unit 16-2. When the soft decision decoder processing unit 18 is enabled, it performs soft decision decoding on its respective inputs (e.g., encoded data input from reader unit 12). Since the hard decision decoder processing units 16-1 and 16-2 are disabled, they do not perform a decoding while the soft-decision decoder processing unit 18 performs its decoding. When the soft decision decoder processing unit 18 has completed its decoding, it may output decoded data to controller 31.

In the arrangement shown in FIG. 1, the soft decision decoder processing unit 18, during a given cycle, can write twice as much data to the memory segment 14 and read twice as much data from the memory segment 14 as that of each of the hard decision decoder processing units 16-1 and 16-2. While FIG. 1 shows an embodiment with a soft decision decoder processing unit (e.g., 18) being able to write/read 6 bits of data to/from the memory segment 14 during a given cycle, and hard decision decoder processing units (e.g., 16-1 and 16-2) being able to write/read 3 bits of data to/from the memory segment 14 during the given cycle, embodiments of the inventive concept are not limited thereto. For example, the data bus can be increased to 8-bits by adding two data lines (e.g., channels) between the memory segment 14 and the soft decision decoder processing unit 18 so it can exchange 8 bits of data with the memory segment 14 during a given cycle, and one of the added data lines is connected to each of the hard decision decoder processing units so that they can each exchange 4 bits of data with the memory segment 14 during the given cycle. In yet another possible embodiment the two extra bits may be used by another hard decision unit which operates with only 2 bits for messages, in parallel with the former two processing units 16-1 and 16-2. The additional hard decision processing unit may be in operation both in the hard decision mode and in a soft decision mode. For the scheme, either 3 decoding output in parallel are provided in a hard decision mode while in soft decision mode 2 decoded outputs are provided, one by the soft decision unit which operate on 6 bits out of the 8 data bus bits, and another decoded output is provided by the additional hard decision unit.

The decoder unit 10 can be configured to initially use hard decision decoding as its main decoding technique, and only rely on soft decision decoding as a backup to enable recovery from hard decision error events. For example, if the hard decision decoder processing units 16-1 and 16-2 were unable to decode encoded data from memory 19, the soft decision decoder processing unit 18 can be enabled later to decode the encoded data.

In an exemplary embodiment, the memory 19 or the memory segment 14 is non-volatile memory. For example, the non-volatile memory may be flash memory or configured with flash memory chips, but the present inventive concept is not limited thereto. Flash memory represents non-volatile memory for storing data. According to an exemplary embodiment of the invention, the flash memory includes (planerty) NAND or VNAND flash memory. The flash memory may be single-level cell (SLC), multi-level cell (MLC) flash memory or triple-level (TLC), etc. The flash memory is not limited to any particular capacity or configuration. For example, the number of physical blocks, the number of physical pages per physical block, the number of sectors per physical page, and the size of the sectors may vary. However, in a more typical embodiment of the inventive concept, the memory 19 is a non-volatile memory and the memory segment 14 is a volatile memory.

In at least one embodiment of the present inventive concept, the memory 19 or the memory segment 14 is configured with, e.g., variable resistance memory chips. The variable resistance memory means a memory which stores data using a phenomenon in which the resistance of a material varies according to an applied signal. Examples of the variable resistance memory include a magnetic RAM (MRAM) in which the variable resistance is implemented by using a magnetic change in a tunneling magneto-resistive (TMR) film, a phase change memory (PCM or PRAM) in which the variable resistance is implemented by using a phase change phenomenon of chalcogenide alloys, and a resistive RAM (PRAM) in which the variable resistance is implemented by using a resistance change in a resistance change film. The flash memory can be replaced with the variable resistance memory if necessary.

Figure 3:
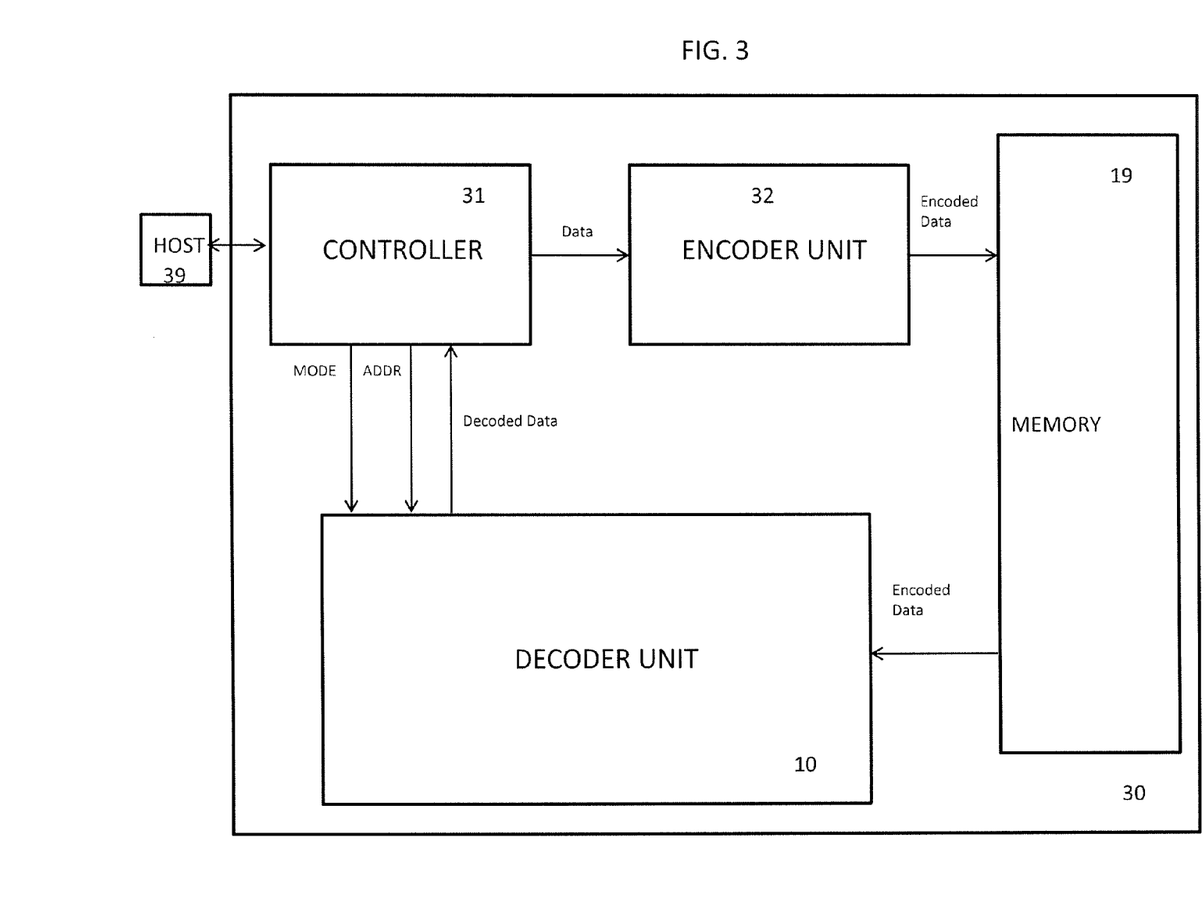
FIG. 3 is a block diagram showing a solid state storage device unit according to an exemplary embodiment of the present inventive concept.

FIG. 3 is a block diagram of a solid state storage device 30 coupled in communication to a host 39. As depicted in FIG. 3, device 30 includes the controller 31, an encoder unit 32, and the memory 19 and decoder unit 10.

Controller 31 is configured to receive data from host 39 and store the data in memory 19 in response to a write request received from host 39. Prior to the data being stored in memory 19, the encoder unit 32 can encode the data using a code (e.g., an LPDC code, a Turbo code, etc.). Controller 31 is further configured to read data stored in memory 19 or data from the decoder unit 10 in response to a read request received from host 39. The data read from memory 19, which was previously encoded using the code, may be decoded by one or more soft decision decoder processing units (e.g., 18) or one or more hard decision decoder processing units (e.g., 16-1 and 16-2) of the decoder unit 10. Controller 31 is configured to provide successfully decoded data to host 39 in response to the read request. The controller 31 may store data into memory 19 without using the encoder unit 32 and read the un-encoded data back from the memory 19.

Controller 31 may be implemented with a general purpose microprocessor, a microcontroller, a digital signal processor (DSP), and application specific integrated circuit (ASIC), a field programmable gate array (FPGA), a programmable logic device (PLD), a controller, a state machine, gated logic, discrete hardware components, or a combination of the foregoing. One or more sequences of instructions performed by the controller 31 may be stored as firmware on a ROM within controller 31 or external to controller 31. One or more sequences of instructions may also be stored and read from another storage medium, such as memory 19, or received from host 39 via a host interface (not shown).

Device 30 may also include RAM either internal to controller 31 or external to controller 31 to provide temporary storage of data (e.g., a buffer) and instructions and variables/settings that may be used by controller 31 to manage decoder unit 10 and perform the operations described herein. ROM, RAM, storage mediums, and flash memory represent examples of machine or computer readable media on which instructions/code executable by the controller 31 may be stored. Machine or computer readable medium may generally refer to any medium or media used to provided instructions to the controller 31, including both volatile media, such as dynamic memory used for storage media or for buffers within the controller 31, and non-volatile media, such as electronic media, optical media, and magnetic media.

The host interface may include a protocol for performing data exchange between the host 39 and the controller 31. The controller 31 may be configured to communicate with the host 39 through at least one of various interface protocols, e.g., a universal serial bus (USB) protocol, multimedia card (MMC) protocol, peripheral component interconnection (PCI) protocol, PCI-express (PCI-E) protocol, advanced technology attachment (ATA) protocol, serial-ATA protocol, parallel-ATA protocol, small computer small interface (SCSI) protocol, enhanced small disk interface (ESDI) protocol, and integrated drive electronics (IDE) protocol. The host interface may include one or more buffers for buffering transmission between host 39 and controller 31.

Host 39 represents a device configured to be coupled to solid state storage device 30 and to store data in solid state storage device 30 and read data from solid state storage device 30. Host 39 may be a computing system such as a personal computer, a server, a workstation, a laptop computer, PDA, smart phone, etc. Alternatively, the host device may be an electronic device such as a digital camera, a digital audio player, a digital video recorder, etc.

Figure 4:
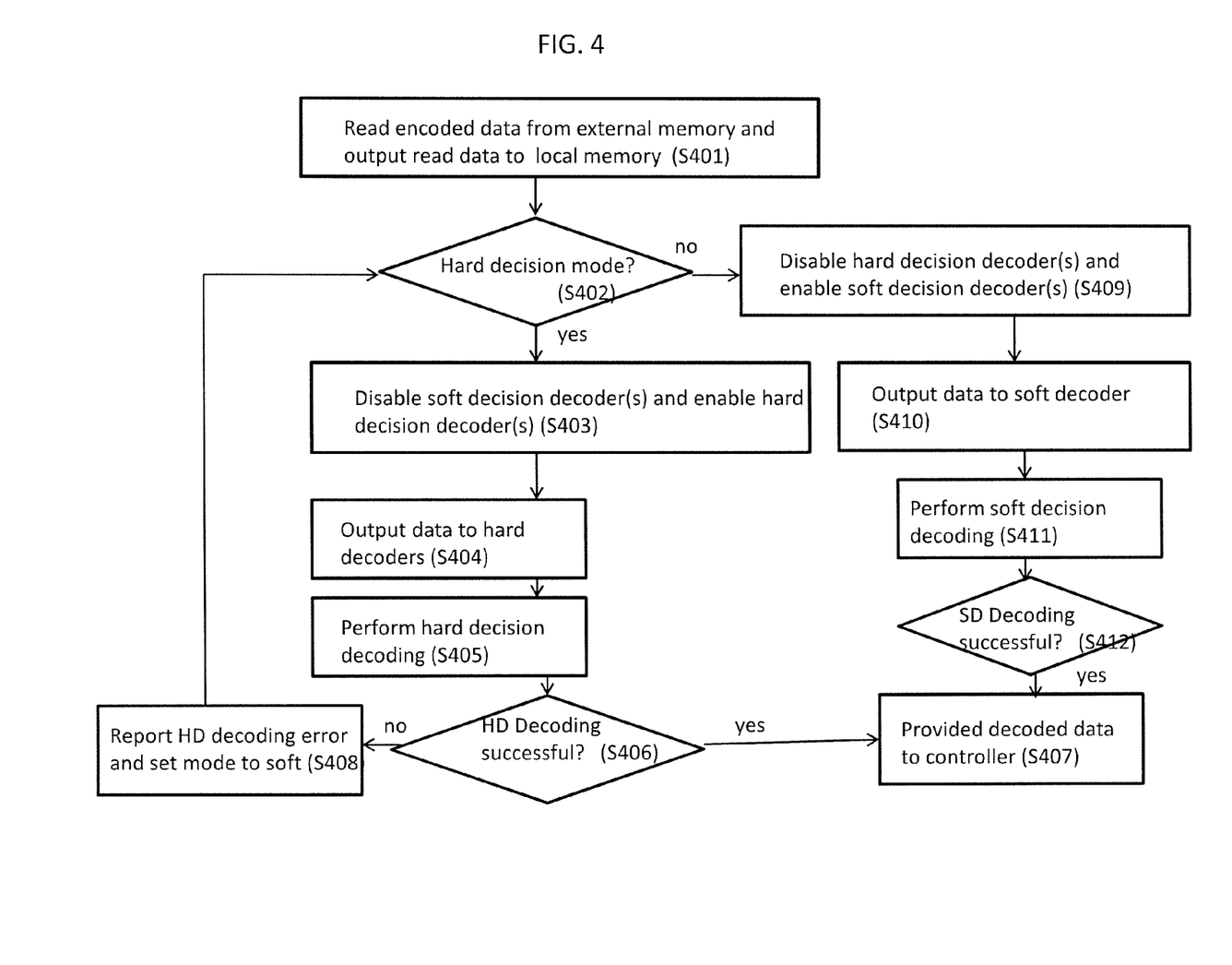
FIG. 4 is a flow chart illustrating a method of decoding data according to an exemplary embodiment of the present inventive concept.

FIG. 4 illustrates a flow chart of a method of decoding data using the decoder unit of FIG. 1 according to an exemplary embodiment of the inventive concept.

The method includes reading encoded data from external memory (e.g., memory 19) (S401). For example, the reader unit 12 may be read data from a location in the external memory based on an address signal ADDR received from controller 31.

The method further includes determining whether the current mode is a hard decision decoding mode or a soft decision decoding mode (S402). For example, the reader unit 12 may determine the current mode based on receipt of a mode signal MODE from controller 31. The reader unit 12 may include a register (not shown) that stores the state of the current mode. The reader unit 12 may store a default mode, such as the hard decision decoding mode. Instead of the reader unit 12 receiving the mode signal MODE from the controller 31, the reader unit 12 may periodically toggle between the two modes based on whether a given decoding type was successful.

If it is determined that the current mode is the hard decision decoding mode, the method includes disabling the soft decision decoder processing unit(s) and enabling the hard decision decoder processing units (S403). For example, the reader unit 12 outputs control signals to disable the soft decision decoder processing unit(s) and enable the hard decision decoder processing unit(s).

After the hard decision decoder processing unit(s) have been enabled, the read encoded data is output to the hard decision decoder processing units (S404). For example, after enabling the hard decision processing unit(s), the reader unit outputs part of the read encoded data to each of the enabled decoders.

A hard decision decoding is then performed by each hard decision decoder processing unit on its respective input using a different part of the data bus connected with a common memory for exchanging messages used in the decoding (S405). For example, if 2 hard decision decoder processing units are available, the hard decision decoder processing units simultaneously perform a hard decision decoding on their respective inputs.

After the hard decision decoding has been performed, a determination is made as to whether the hard decision decoding was successful (S406). Although not shown in FIG. 1, the decoder unit 10 may further include a checking unit that receives the outputs of the hard decision decoder processing units and performs an operation on the outputs to determine whether the encoded data has been successively decoded.

If it has been determined that the hard decision decoding was successful, the method includes providing the decoded data to the controller 31 (S407). For example, the checking unit or the hard decision decoder processing unit(s) may provide the decoded data to the controller 31. For example, the first hard decision decoder processing unit 16-1 can provide decoded data based on part of the encoded data retrieved by the reader unit 12 during a given cycle and the second hard decision decoder processing unit 16-2 can provide decoded data based on the remaining part of the encoded data retrieved by the reader unit 12 during the given cycle. Thus, the hard decision decoder processing units operate in parallel. If one or more of the hard decision decoder processing units is unable to decode their portion of the data, they can report an error to the checking unit or directly to the controller 31. Thus, even if some of the hard decision decoder processing units were unable to decode, it can be treated as if the entire hard decision decoding failed.

If it has been determined that the hard decision decoding was a failure, the method includes reporting a hard decision decoding error and setting the current mode to the soft decision mode (S408). In an exemplary embodiment of the inventive concept, the checking unit reports the error to the controller 31 and the controller 31 sends a mode signal MODE to the reader unit 12 indicating that the current mode is to be changed to the soft decision decoding mode. In another exemplary embodiment of the inventive concept, the checking unit does not report an error to the controller 31 and the checking unit sends an internal mode signal MODE to the reader unit 12 indicating that the mode is to change to the soft decision decoding mode.

When it is determined that the current mode is the soft decision decoding mode, the method includes disabling the hard decision decoder processing unit(s) (e.g., 16-1 and 16-2) and enabling the soft decision decoder processing unit(s) (e.g., one or more 18) (S409). For example, the reader unit 12 outputs control signals to disable the hard decision decoder processing unit(s) and enable the soft decision decoder processing unit(s).

Once the soft decision decoder processing units have been enabled, the method includes outputting read encoded data to the soft decision decoder processing units (S410). Next a soft decision decoding is performed by the enabled decoder processing units on encoded data (e.g., received from reader unit 12) using all bits of the data bus to exchange messages with the local memory (e.g., memory segment 14) (S411). Next, a determination is performed to determine whether the soft decision decoding is successful (S412). For example, the checking unit may receive an output of the soft decision decoding and perform on operation on the output to determine whether the encoded data has been successfully decoded.

If the encoded data was determined to be successfully decoded using the soft decision decoder, the method provides the decoded data to controller 31 (S407). If the encoded data was not successfully decoded, the method reports a decoding error (e.g., soft decision decoding error) to the controller 31. The controller 31 upon receiving an indication that both the hard and soft decoding attempts have failed, may then instruct the decoder unit 10 to either retry the decoding or to perform a new decoding on encoded data in another location within memory 19.

Figure 5:
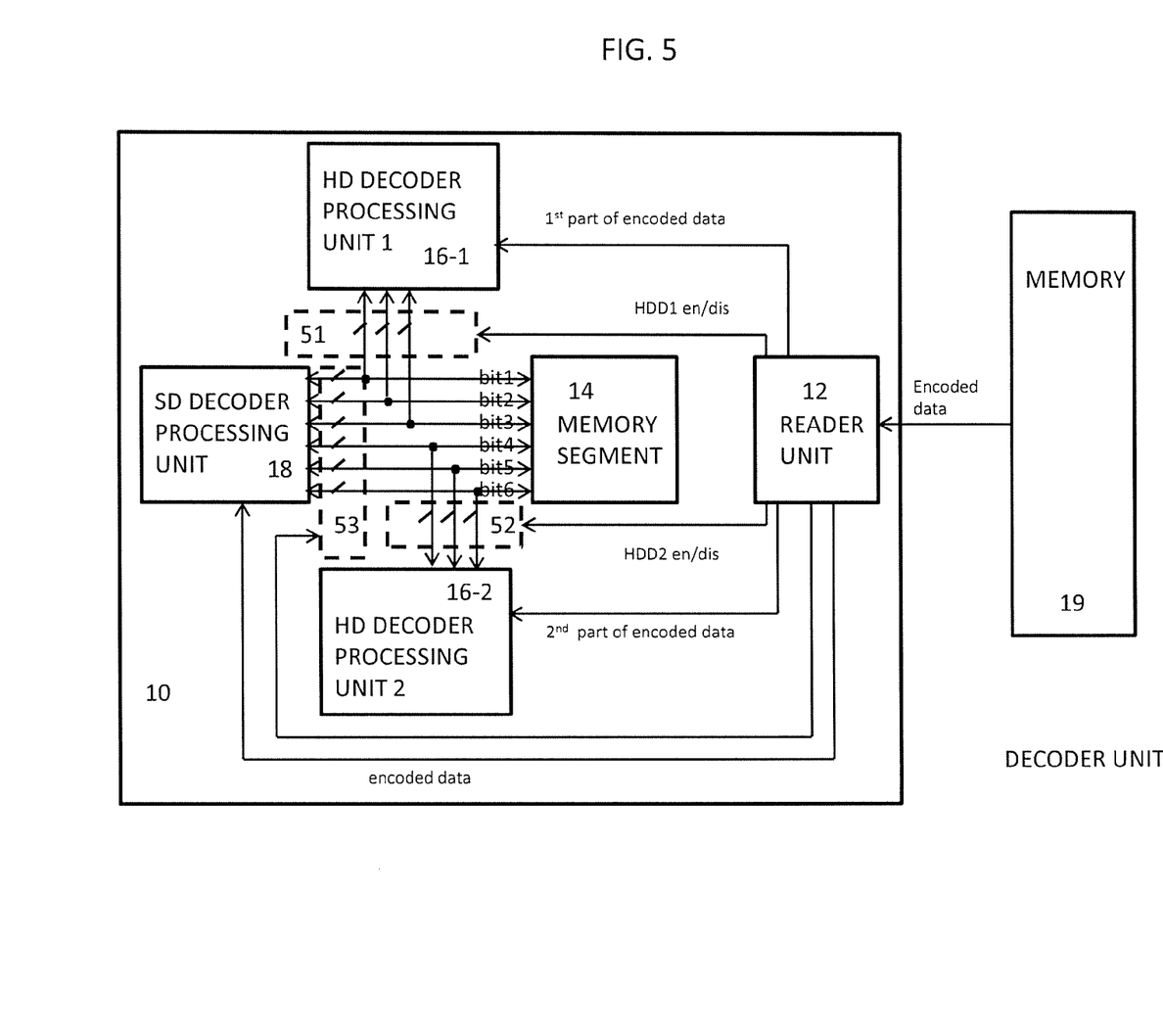
FIG. 5 is a block diagram showing a decoding unit according to an exemplary embodiment of the present inventive concept.

FIG. 5 shows a variation on the embodiment of the decoder unit 10 illustrated in FIG. 1. In this embodiment, the size/width of the data bus routed to each of the decoder processing units is configurable dynamically by the reader unit 12 using connection configuration units 51, 52, and 53. In an exemplary embodiment, the connection configuration units 51-53 each include several switches that are opened or closed in response to receiving an enable/disable signal from the reader unit 12. Thus, in this embodiment, the decoder processing units are not enabled/disabled based on the mode of operation (e.g., hard/soft decision decoding modes). For example, during the hard decision decoding mode the switches of the third connection configuration unit 53 are opened and the switches of the first and second connection configuration units 51 and 52 are closed, whereas during the soft decision decoding mode the switches of the first and second connection configuration units 51 and 52 are opened and the switches of the third connection configuration unit 53 are closed. The same signals that were used to enable/disable the decoder processing units in FIG. 1 may be used to control the switches of the connection configuration units.

In another exemplary embodiment, all of the decoder processing unit(s) of FIG. 5 are replaced with a single decoder processing unit that is capable of performing both hard and soft decision decoding, and a connection configuration unit or a configurable bus is controlled to route respective parts/lines of the data bus to nodes of the single decoder processing unit responsible for different decoding methods. For example, the single decoder processing unit may include a first set of 6 nodes for communicating messages with the memory segment 14 designed for performing hard decision decoding and a second set of 6 nodes for communicating messages with the memory segment 14 designed for performing soft decision decoding. For example, the reader unit 12 could route data lines 1-3 of the data bus to nodes 1-3 of the first set of nodes and data lines 4-6 of the data bus to nodes 4-6 of the first set of nodes during the hard decision decoding mode, and route data lines 1-6 to nodes 1-6 of the second set of nodes during the soft decision decoding mode. Please note that use of a 6 bit bus is merely an example, as the data bus may have various sizes (e.g., 8 bit, 16 bit, 32 bit, 64 bit, etc). For example, additional nodes may be added to accommodate the larger bus.

Figure 6:
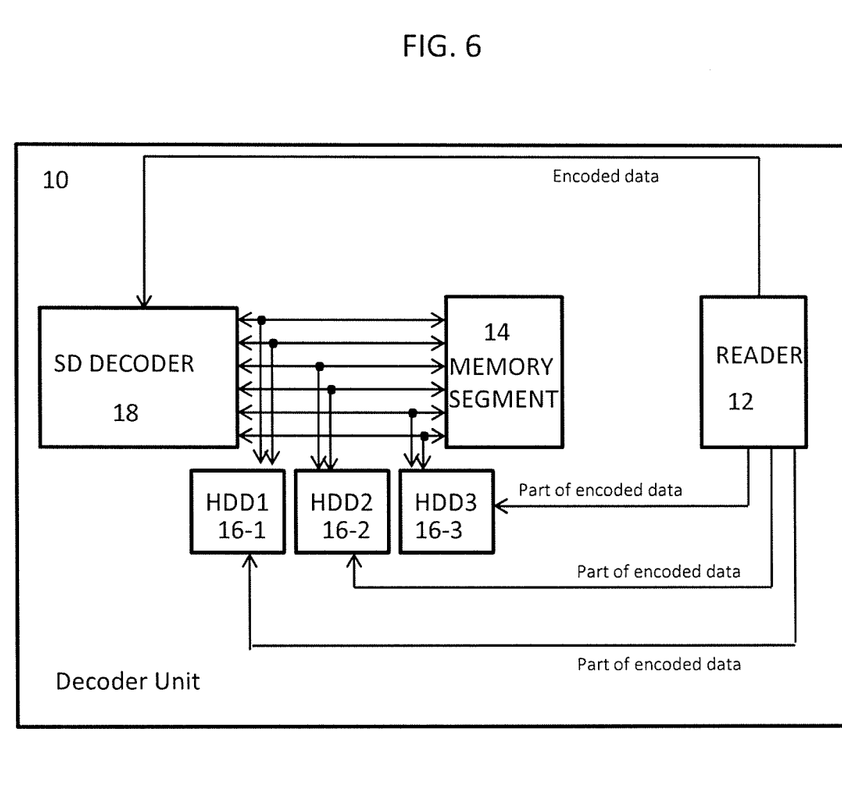
FIG. 6 is a block diagram showing a decoding unit according to an exemplary embodiment of the present inventive concept.

FIG. 6 illustrates a decoding unit according to an exemplary embodiment of the inventive concept. The decoder unit 10 of FIG. 6 is similar to the decoder unit 10 of FIG. 1, but includes three hard decision decoder processing units 16-1, 16-2, and 16-3, and each exchanges 2-bit data with the memory segment 14 as opposed to 3-bit data. Further, the reader unit 12 of FIG. 6 may provide an additional control signal to enable/disable the additional hard decision decoder processing unit or control a configurable data bus to route exchanges of data between each processing unit and the memory segment 14. For example, in cases where raw bit error rate (BER) is low, lower precision may be applied for hard decision decoding. Hence, the decoder unit 10 of FIG. 6, during the hard decision decoding mode, can operate on three codewords in parallel using the same memory segment 14 as illustrated in FIG. 1.

Figure 7:
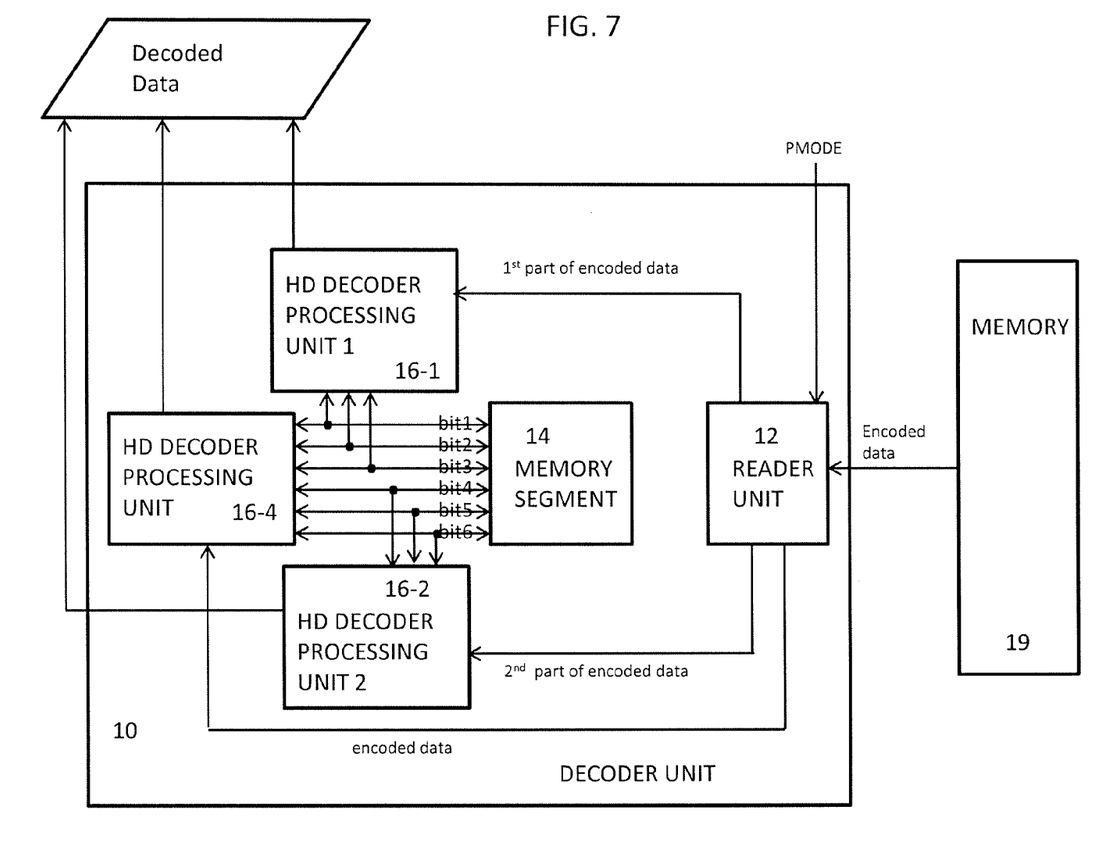
FIG. 7 is a block diagram showing a decoding unit according to an exemplary embodiment of the present inventive concept.

FIG. 7 illustrates a decoder unit according to an exemplary embodiment of the inventive concept. The decoder unit 10 of FIG. 7 is similar to the decoding unit of FIG. 1, except that the soft decision decoder processing unit 18 is replaced with a hard decision decoder processing unit 16-4 that is required to exchange twice as much data with the memory segment 14 as the other hard decision decoder processing units 16-1 and 16-2. Further, the decoder unit 10 of FIG. 7 operates in one of a high precision hard decision decoding mode and a low precision hard decision decoding mode. For example, the reader unit 12 of FIG. 7 may receive a mode signal PMODE indicating whether to operate in the high precision hard decision decoding mode or low precision hard decision decoding mode. For example, the mode signal PMODE may be output by controller 31 to the decoding unit 10 or to the reader unit 12. The mode signal PMODE may have one logic level (e.g., a logic 1) to indicate the low precision mode and another logic level (e.g., a logic 0) to indicate the high precision mode. The reader unit 12 can disable the high precision hard decision decoder processing unit 16-4 or prevent 16-4 from exchanging messages with the memory segment 14 and enable the low precision hard decision decoder processing units 16-1 and 16-2 or allow 16-1 and 16-2 to exchange messages with the memory segment 14 when the current mode is set to the low precision hard decision decoding mode. The reader unit 12 can disable the low precision hard decision decoder processing units 16-1 and 16-2 or prevent 16-1 and 16-2 from exchanging messages with memory segment 14 and enable the high precision hard decision decoder processing unit 16-4 or allow 16-4 to exchange messages with the memory segment 14 when the current mode is set to the high precision hard decision decoding mode.

In another embodiment, all of the hard decision decoder processing units of FIG. 7 are replaced with soft decision decoder processing units. In this embodiment, the controller 31 can select among low and high precision soft decision decoding modes.

Figure 8:
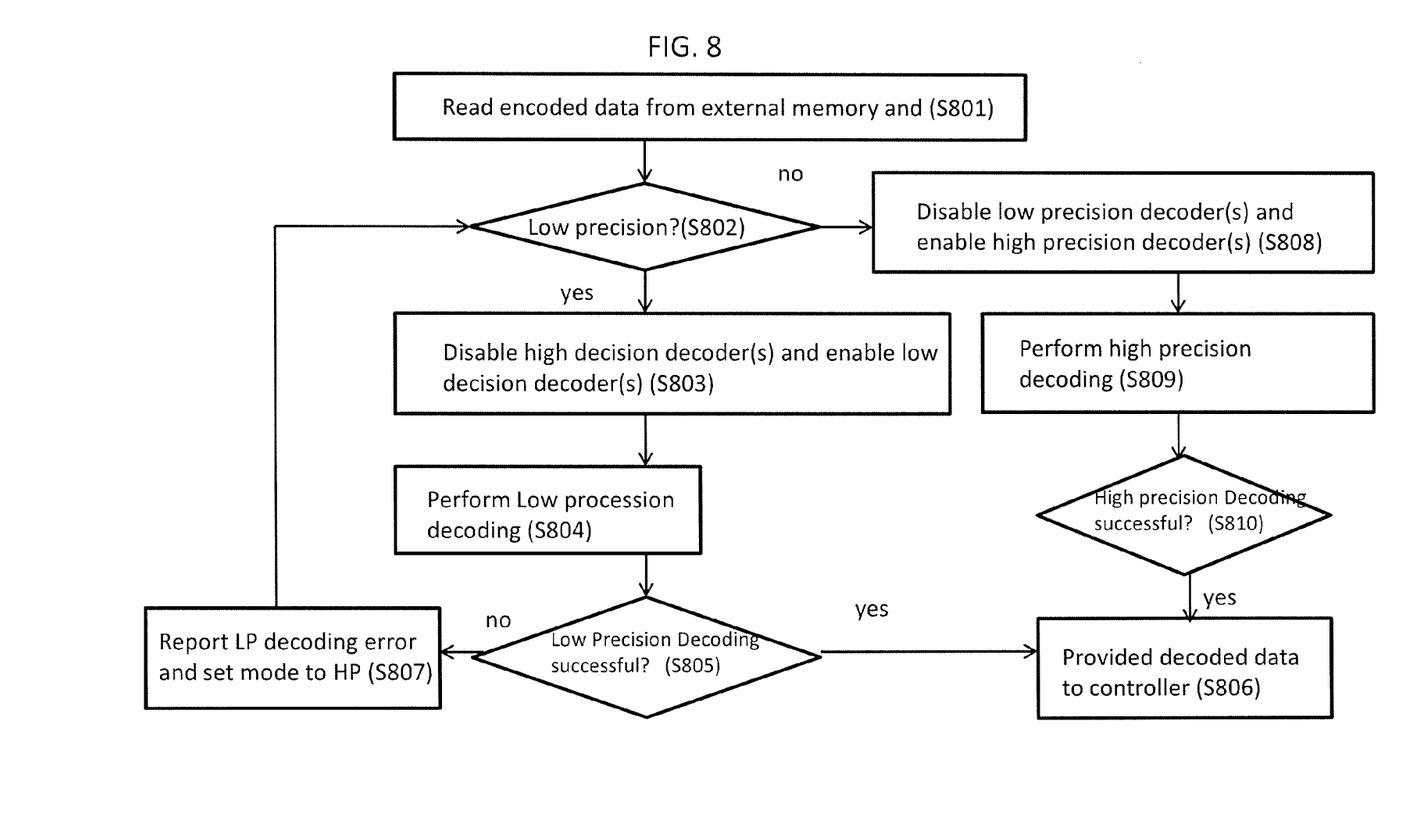
FIG. 8 is a flow chart illustrating a method of decoding data according to an exemplary embodiment of the present inventive concept.

FIG. 8 illustrates a flow chart of a method of decoding data using the decoding unit of FIG. 7 according to an exemplary embodiment of the inventive concept.

The method includes reading encoded data from external memory (e.g., memory 19) (S801). For example, the reader unit 12 may read data from a location in the external memory based on an address signal ADDR received from controller 31.

The method further includes determining whether the current mode is a low precision hard decision decoding mode or a high precision hard decision decoding mode (S802). For example, the reader unit 12 may determine the current mode based on receipt of a mode signal PMODE from controller 31 (e.g., high precision hard decision mode or low precision hard decision mode). The reader unit 12 may include a register (not shown) that stores the state of the current mode. The reader unit 12 may store a default mode, such as low precision hard decision decoding mode. Instead of the reader unit 12 receiving the mode signal PMODE from the controller 31, the reader unit 12 may periodically toggle between the two modes based on whether a given decoding type was successful.

If it is determined that the current mode is the low precision hard decision decoding mode, the method includes disabling the high precision hard decision decoder processing unit 16-4 or preventing 16-4 from exchanging messages with memory segment 14, and enabling the low precision hard decision decoder processing units 16-1 and 16-2 or allowing 16-1 and 16-2 to exchange messages with memory segment 14 (S803).

Once the low precision hard decision decoding has been enabled, low precision hard decision decoding is performed in parallel on respective inputs received from the reader unit 12 using respective sub-parts of the data bus to exchange respective messages with the memory segment (S804). For example, if 2 low precision hard decision decoder processing units are available, the low precision hard decision decoder processing units simultaneously perform a low precision hard decision decoding on their respective inputs while sharing the common memory segment 14 for exchange of messages along respective parts of the data bus.

After the low precision hard decision decoding has been performed, a determination is made as to whether the low precision hard decision decoding was successful (S805). Although not shown in FIG. 7, the decoding unit 10 make further include a checking unit that receives the outputs of the low precision hard decision decoder processing units (16-1 and 16-2) and performs an operation on the outputs to determine whether the encoded data has been successively decoded.

If it has been determined that the low precision hard decision decoding was successful, the method includes providing the decoded data to the controller 31 (S806). For example, the checking unit or the low precision hard decision decoder processing units may provide the decoded data to the controller 31. For example, the first hard decision decoder processing unit 16-1 can provide decoded data based on part of encoded data read by the reader unit 12 and the second hard decision decoder processing unit 16-2 can provide decoded data based on another part of encoded data read by the reader unit 12.

If it has been determined that the low precision hard decision decoding was a failure (e.g., one or more of the low precision hard decision processing units was unable to decode), the method includes reporting a low precision hard decision decoding error and setting the current mode to the high precision hard decision decoding mode (S807). In an embodiment, the checking unit reports the error to the controller 31 and the controller 31 sends a mode signal PMODE to the reader unit 12 indicating that the mode is to change to the high precision hard decision decoding mode. In another embodiment, the checking unit does not report an error to the controller 31 and the checking unit sends an internal mode signal PMODE to the reader unit 12 indicating that the mode is to change to the high precision hard decision decoding mode.

When it is determined that the current mode is the high precision hard decision decoding mode, the method includes disabling the low precision hard decision decoders (e.g., 16-1 and 16-2) or preventing them from exchanging messages with memory segment 14, and enabling the high precision hard decision decoders (e.g., one or more 16-4) or allowing them to exchange messages with the memory segment 14 (S808).

Once the high precision hard decision decoding has been enabled, a hard decision decoding is performed on encoded data received from the reader unit 12 by using all bits of the data bus to exchange messages with the memory segment 14 (S809). Next, a determination is performed to determine whether the high precision hard decision decoding is successful (S810). For example, the checking unit may receive an output of the high precision hard decision decoding processing unit and perform an operation on the output to determine whether the encoded data has been successfully decoded.

If the encoded data was determined to be successfully decoded using the high precision hard decision decoder processing units, the method provides the decoded data to controller 31 (S806). If the encoded data was not successfully decoded, the method reports a decoding error (e.g., high precision hard decoding error) to the controller 31. The controller upon receiving an indication that both the low and high precision hard decision decodings have failed may then instruct the decoding unit 10 to either retry the decoding or to perform a new decoding on encoded data in another location within memory 19.

Further, although not shown in FIG. 7, the decoder unit 10 may include a soft decision decoder processing unit that remains disabled (or is prevented from exchanging messages with memory segment 14) until both the low and high hard decision decodings have failed, which then becomes enabled (or allowed to exchange messages with memory segment 14) to perform a soft decision decoding on the encoded data. For example, FIG. 7 can be modified to include the soft decision decoder processing unit 18 of FIG. 1 and connected to the same number of data lines of the memory segment 14 as those received by the high precision hard decision decoder processing unit 16-4. In this embodiment, an additional operation mode is present, namely a soft decision decoding mode. Thus, the decoding unit 10 may be in one of three modes, namely a low precision hard decision decoding mode, a high precision hard decision decoding mode, and a soft decision decoding mode. Accordingly, the controller 31 may be adapted to output a mode signal to the decoding unit having a value that indicates whether to perform hard or soft decision decoding and the precision level. For example, one bit of the mode signal can indicate whether to perform hard or soft decision decoding and another bit of the mode signal can indicate the size of the data to be exchanged with the memory segment 14 (e.g., 00 for hard decision decoding and 6 bit data exchange with memory segment 14, 01 for hard decision decoding and 3 bit data exchange, 10 for soft decision decoding and 6 bit data exchange, and 11 for soft decision decoding and 3 bit data exchange).

Figure 9:
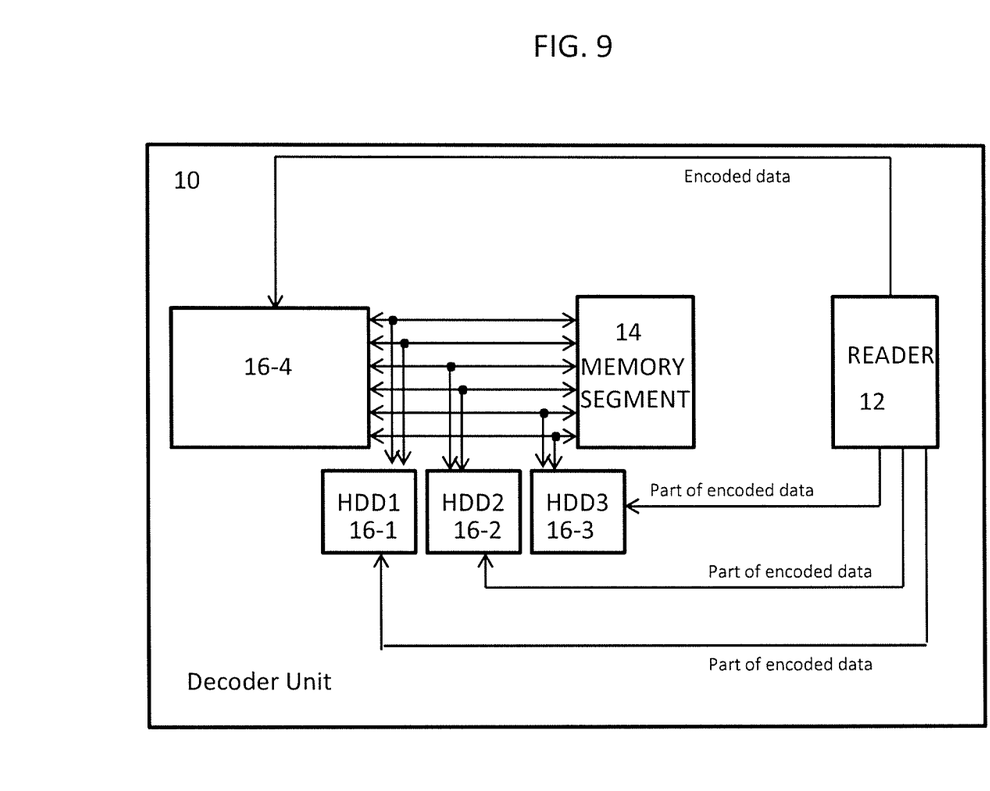
FIG. 9 is a block diagram a showing a decoding unit according to an exemplary embodiment of the present inventive concept.

FIG. 9 illustrates a decoding unit according to an exemplary embodiment of the inventive concept. The decoding unit 10 is similar to the decoding unit 10 of FIG. 6, except the soft decision decoder processing unit 18 is replaced with the high precision hard decision decoder processing unit 16-4 of FIG. 7.

Please note, while the above has shown each of the decoder units including a reader unit 12, in alternate embodiments, the reader unit 12 that retrieves the encoded data from memory 19 may be located external to the decoding unit 10.

Figure 10:
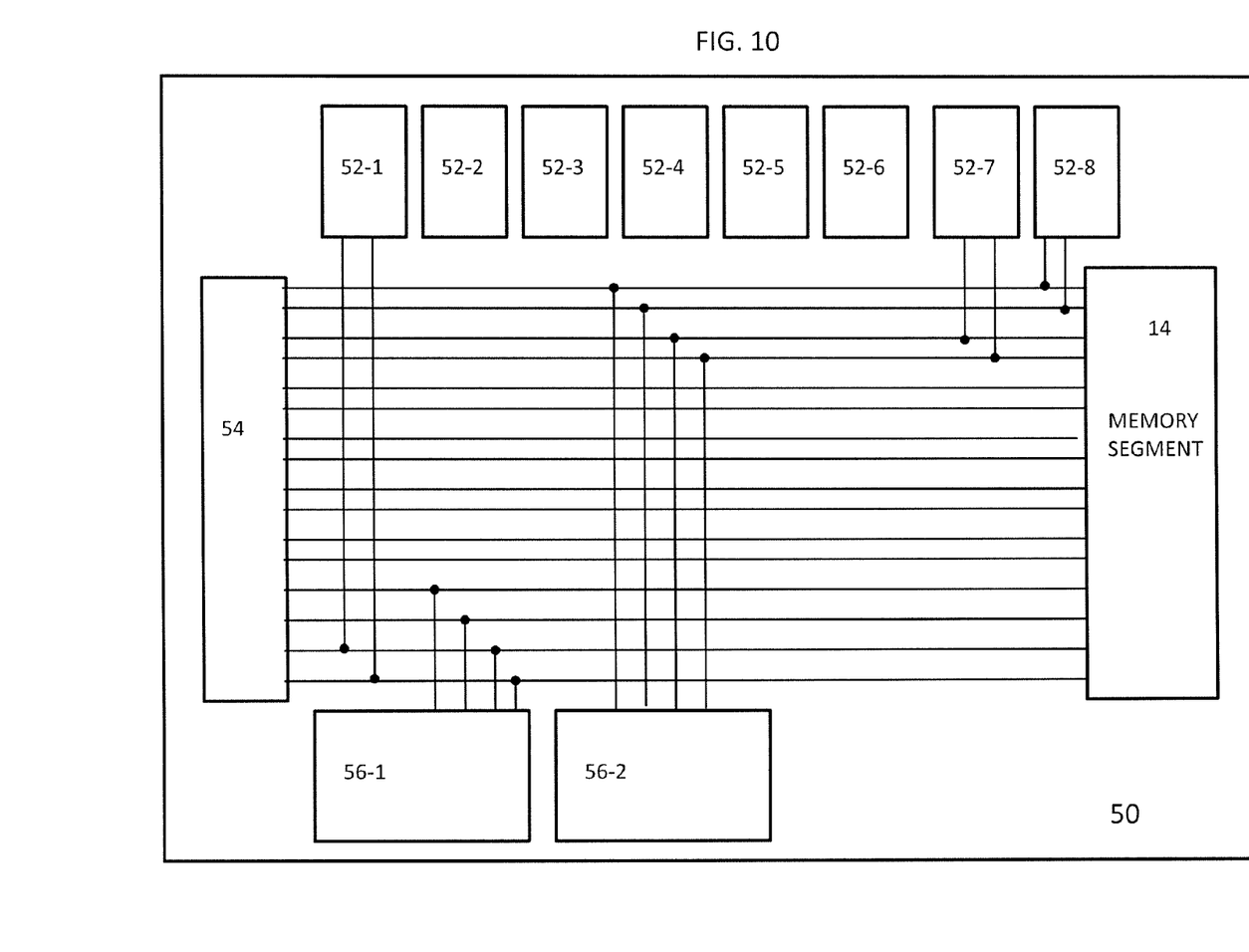
FIG. 10 is a block diagram showing a decoding unit according to an exemplary embodiment of the inventive concept.

FIG. 10 is a block diagram showing a decoding unit 50 according to an exemplary embodiment of the inventive concept. The decoding unit 50 includes a first set of first decoder processing units 52-1, 52-2, 52-3, 52-4, 52-5, 52-6, 52-7, 52-8, a second set of second decoder processing units 54-1 and 54-2, and a third set of decoder processing units 56, where each unit performs a message-passing decoding by exchanging messages across a data bus 60 including several data lines. While FIG. 10 illustrates the data bus 60 having 16 data lines, the inventive concept is not limited to a data bus of any particular size, as the data bus may have a lesser or greater number of data lines (e.g., 8, 10, 13, 32, etc.)

Each of the decoder processing units of the first set exchange 2-bit messages with the memory segment 14. Not all of the decoder processing units of the first set need be activated at the same time. For example, FIG. 10 illustrates that only the first, seventh, and eighth units (e.g., 52-1, 52-7, 52-8) are activated and the remainder are deactivated. While FIG. 10 illustrates the first set including 8 decoder processing units, and each exchanging 2-bit messages, the inventive concept is not limited thereto. For example, the first set may include fewer or greater than 8 such units, and each unit may be altered to exchange messages of a size less than or greater than 2-bits.

Each of the decoder processing units of the second set exchange 4-bit messages with the memory segment 14. Not all of the decoder processing units of the second set need be activated at the same time. For example, while FIG. 10 illustrates both of the decoder processing units of the second set being activated, in an alternate embodiment, one of the units of the set may be deactivated. While FIG. 10 illustrates the second set including 2 decoder processing units and each unit exchanging 4-bit message with the memory segment 14, the inventive concept is not limited thereto. For example, the second set may include fewer or greater than 2 such units, and exchange messages with the memory segment 14 sized less than or greater than 4 bits.

Each of the decoder processing units of the third set exchange 16-bit data with the memory segment 14. While FIG. 10 illustrates the third set including 1 decoder processing unit exchanging a 16-bit message with the memory segment 14, the inventive concept is not limited thereto. For example, the third set may include greater than 1 such unit, and exchange messages with the memory segment 14 sized less 16 bits or greater than 16 bits, assuming the size of the data bus 60 is increased accordingly.

Any of the sets of decoder processing units may be omitted. Moreover, each different set of decoder processing units may be configured to perform either hard, soft, or both hard and soft decision decoding. All the active decoder processing units of a given set can operate in parallel with one another. Thus, the decoder unit 50 may be configured to include several different types of decoder processing units, where units of each set exchange messages with the memory segment 14 with a potentially a different bit count.

In at least one embodiment of the inventive concept, the decoder units 10 or decoder unit 50 may be incorporated into a system on chip SoC. A SoC is an integrated circuit (IC) that integrates all components of an electronic system (e.g., components of decoder unit 10/50) into a single chip.

While embodiments have been described where soft decision decoding is performed after an error occurs during a hard decision decoding, the inventive concept is not limited thereto. For example, a decoder unit according to an exemplary embodiment of the inventive concept may switch between one type of decoding to another type of decoding based on user defined reasons such a a-priori side information on the quality of part of a storage medium or the codes or reasons related to un-equal error protection.

Please note that the encoded data processed by a decoder processing unit according to an exemplary embodiment of the inventive concept may include a generalized low density parity check code, a non-binary low density parity check code, a turbo code, a turbo-like code, an algebraic code including but not limited to a Reed Solomon (RS) code, a BCH code, a Hamming code, a Hadamard code, a convolution code, a low-density convolutional code. Accordingly, an encoder unit according to an exemplary of the inventive concept may be configured to encode data using one or more of the above-described code types. Further, the inventive concept is not limited to use of the listed code types, as other code types may be decoded and encoded by a decoder and an encoder, respectively, in embodiments of the inventive concept.

Although the present inventive concept has been described in connection with exemplary embodiments thereof, those skilled in the art will appreciate that various modifications can be made to these embodiments without substantially departing from the principles of the present inventive concept.

What is claimed is:

1. A decoder unit configured to perform a decoding on encoded data, the decoder unit comprising:
   a plurality of data lines;
   a local memory configured to store a message for a message-passing decoding of the encoded data and communicate the message across the data lines;
   a first decoder processing unit configured to perform a hard decision decoding on a first part of the encoded data using a first part of the message received from the local memory across a first part of the data lines;
   a second decoder processing unit configured to perform a hard decision decoding on a second part of the encoded data using a second part of the message received from the local memory across a second part of the data lines; and
   a third decoder processing unit configured to perform a soft decision decoding on the entire encoded data using the entire message received from the local memory across all of the data lines.

2. The decoder unit of claim 1, wherein the decoder unit is configured to enable the first and second decoders and disable the third decoder when a current mode indicates that a hard decision decoding is to be performed, and wherein the decoding unit is configured to disable the first and second decoders and enable the third decision decoder when the current mode indicates that a soft decision decoding is to be performed.

3. The decoder unit of claim 1, further comprising a reader unit configured to retrieve the encoded data from an external memory and perform one of i) application of the first part of the encoded data to the first decoder processing unit and application of the second part of the encoded data to the second decoder processing unit and ii) application of the entire encoded data to the third decoder processing unit.

4. The decoder unit of claim 1, wherein the decoder unit is configured to connect the first part of the data lines to the first decoder processing unit and connect the second part of the data lines to the second decoder processing unit, and disconnect the third decoder processing unit from all of the data lines, when a current mode indicates that a hard decision decoding is to be performed, and wherein the decoder unit is configured to disconnect the first and second decoder processing units from all of the data lines and connect the third decoder processing unit to all of the data lines, when the current mode indicates that a soft decision decoding is to be performed.

5. The decoder unit of claim 1, wherein the message has a first bit count when the first and second decoder processing units are activated and the third processing unit is deactivated, and the message has a second bit count greater than the first bit count when the third processing unit is activated and the first and second processing units are deactivated.

6. The decoder unit of claim 1, further comprising: a fourth decoder processing unit configured to perform a hard decision decoding on a third part of the encoded data using a third part of the message received from the local memory across a third part of the data lines, wherein data communicated with the local memory by the third processing unit is three times larger than data communicated with the local memory by each of the first, second and fourth decoders.

7. The decoder unit of claim 1, wherein at least one of the decoder processing units configured to perform hard decision decoding is also configured to perform a soft decision decoding on all the data bits.

8. A solid state storage device comprising the decoder unit of claim 1 and a flash memory comprising the encoded data.

9. A decoder unit configured to perform a decoding on encoded data, the decoder unit comprising:
   a plurality of data lines;
   a local to memory configured to store a message for a message-passing decoding of the encoded data and communicate the message across the data lines;
   a first decoder processing unit configured to perform a hard decision decoding on a first part of the encoded data using a first part of the message received from the local memory across a first part of the data line;
   a second decoder processing unit configured to perform a hard decision decoding on a second part of the encoded data using a second part of the message received from the local memory across a second part of the data lines; and
   a third decoder processing unit configured to perform a soft decision decoding on the entire encoded data using the entire message received from the local memory across all of the data lines,
   wherein the first and second parts of the message are distinct from one another, the first and second parts of the encoded data are distinct from one another, and the first and second parts of the data lines are distinct from one another.

* * * * *